United States Patent
Gu et al.

(10) Patent No.: US 11,955,167 B2
(45) Date of Patent: Apr. 9, 2024

(54) COMPUTING-IN-MEMORY ACCELERATOR DESIGN WITH DYNAMIC ANALOG RAM CELL AND ASSOCIATED LOW POWER TECHNIQUES WITH SPARSITY MANAGEMENT

(71) Applicant: Northwestern University, Evanston, IL (US)

(72) Inventors: Jie Gu, Evanston, IL (US); Zhengyu Chen, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 49 days.

(21) Appl. No.: 17/574,363

(22) Filed: Jan. 12, 2022

(65) Prior Publication Data
US 2022/0223199 A1    Jul. 14, 2022

Related U.S. Application Data

(60) Provisional application No. 63/137,234, filed on Jan. 14, 2021.

(51) Int. Cl.
*G11C 16/34* (2006.01)
*G06F 7/544* (2006.01)
(Continued)

(52) U.S. Cl.
CPC ........ *G11C 11/4096* (2013.01); *G06F 7/5443* (2013.01); *G11C 11/4085* (2013.01);
(Continued)

(58) Field of Classification Search
CPC ............ G11C 11/4096; G11C 11/4085; G11C 11/4094; G11C 27/04; G06F 7/5443; H03M 1/001; H03M 1/462
See application file for complete search history.

(56) References Cited

U.S. PATENT DOCUMENTS

2016/0350182 A1\* 12/2016 Tsutsui .................. G11C 11/408
2020/0342327 A1\* 10/2020 Dong ..................... G06N 3/105
(Continued)

*Primary Examiner* — Min Huang
(74) *Attorney, Agent, or Firm* — BENESCH, FRIEDLANDER, COPLAN & ARONOFF LLP

(57) ABSTRACT

Systems formed by a multi-bit three-transistor (3T) memory cell (i.e., dynamic-analog RAM) are provided. The 3T memory cell includes: a read-access transistor $M_1$ in electrical communication with a read bitline; a switch transistor $M_2$ in electrical communication with the read-access transistor $M_1$; a write-access transistor $M_3$ in electrical communication with the read-access transistor $M_1$ and a write bitline; and a memory node MEM in electrical communication between the read-access transistor $M_1$ and the write-access transistor $M_3$, wherein the memory node MEM is configured to store a 4-bit weight WE. An array of the 3T memory cells (i.e., dynamic-analog RAMs) may form a computing-in-memory (CIM) macro, and further form a convolutional neural network (CNN) accelerator by communicating with an application-specific integrated circuit (ASIC) which communicates with a global weight static random access memory and an activation static random access memory.

13 Claims, 14 Drawing Sheets

(51) Int. Cl.
  *G11C 11/408*  (2006.01)
  *G11C 11/4094*  (2006.01)
  *G11C 11/4096*  (2006.01)
  *G11C 27/04*  (2006.01)
  *H03M 1/00*  (2006.01)
  *H03M 1/46*  (2006.01)

(52) U.S. Cl.
  CPC .......... *G11C 11/4094* (2013.01); *G11C 27/04* (2013.01); *H03M 1/001* (2013.01); *H03M 1/462* (2013.01)

(56) References Cited

U.S. PATENT DOCUMENTS

| | | | |
|---|---|---|---|
| 2020/0402577 A1* | 12/2020 | Onuki | G11C 11/404 |
| 2021/0383881 A1* | 12/2021 | Onuki | G11C 16/3459 |
| 2022/0036165 A1* | 2/2022 | Kwon | G06F 7/5443 |

* cited by examiner

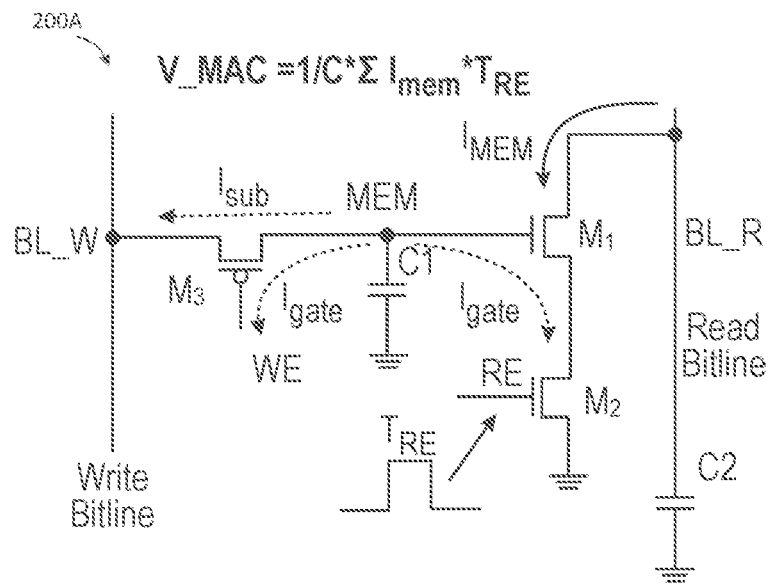
FIG. 2A
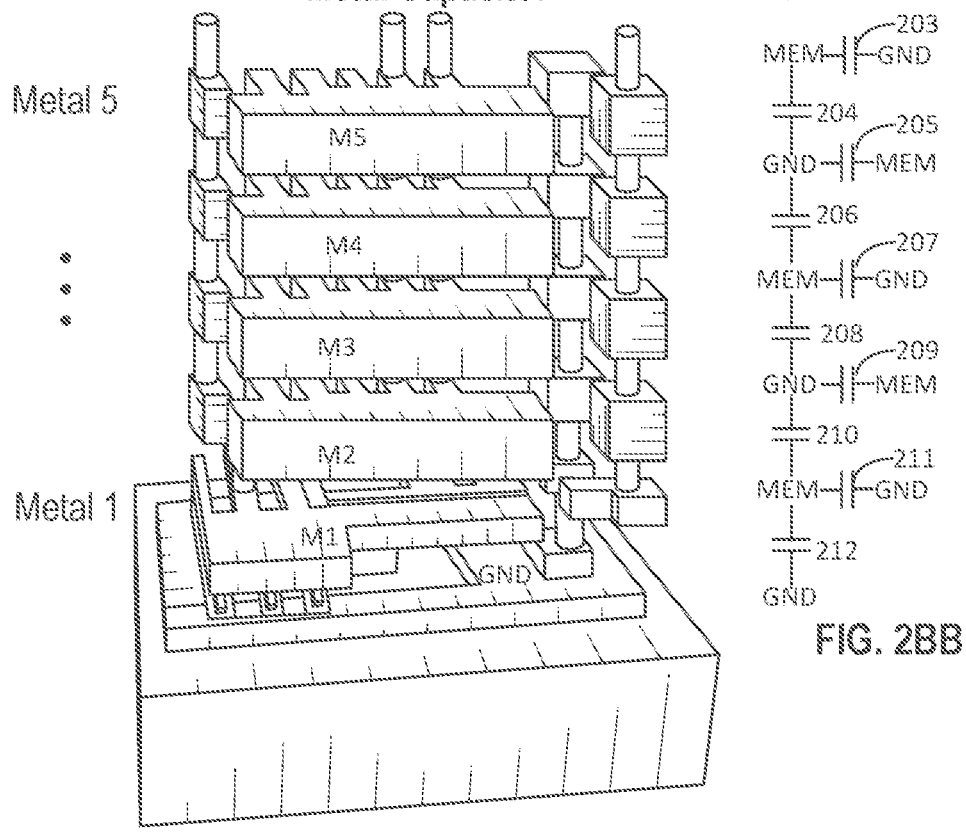
FIG. 2B
FIG. 2BB

Layout of 3T Cell in This Work (Only Shown ME1,Poly)

| | [6] ISSCC 2020 | [2] ISSCC 2020 | [3] ISSCC 2020 | [4] ISSCC 2020 | This work |
|---|---|---|---|---|---|
| Memory Bit | 8T SRAM | 6T SRAM | Twin-8T SRAM | 8T SRAM | 3T Analog RAM |
| Tech. (nm) | 7 | 28 | 55 | 65 | 65 |
| Frequency (MHz) | 222 | 240 | - | 100 | 105 |
| System Area (mm2) | - | - | - | 9 | 3.3 |
| Size of Macro (bit) | 64x64 | 512x64 | 64x60 | 64X64 | 4x64x32 |
| Area of Macro (mm2) | 0.0032 | - | - | 0.148 | 0.05 |
| Activation Precision(bit) | 4 | 4/8 | 1/2/4 | 2/4/9/8 | 4/8 |
| Weight Precision (bit) | 4 | 4/8 | 2/5 | 4/8 | 4/8 |
| ADC Precision (bit) | 4 | 5 | 5 | 5 | 5 |
| Digital Stoarge | - | - | - | 164KB | 172KB |
| Sparsity Support | - | - | - | Activation +weight | Activation+Weight +ADC |
| Power of CIM Macro (mW) | - | - | - | 3.8 | 4.2(raw) 1.98 (w/ Sparsity Saving) |
| Power of system (mW) | - | - | - | 65 | 52.8(raw) 38.42 (w/ Sparsity Saving) |
| Energy Efficiency of CIM Macro at 4bit Weight/Input (TOPS/W) | 321 | 68.44 | 22.96 | 25.83 | 101.3*(raw) 217.2 (w/ Sparsity Saving) |
| Energy Efficiency of System at 4bit Weight/Input (TOPS/W) | - | - | - | 5.83 | 32.6*(raw) 44.8 (w/ Sparsity Saving) |

* The Calculation is Based on 4Bit (Activation) by 4Bit (Weight) VGG Model on Cifar-10; 1Operation (OP) is 1 Multiplication or 1 Addition. Off-Chip/IO Power/Time Not Included.

FIG. 5

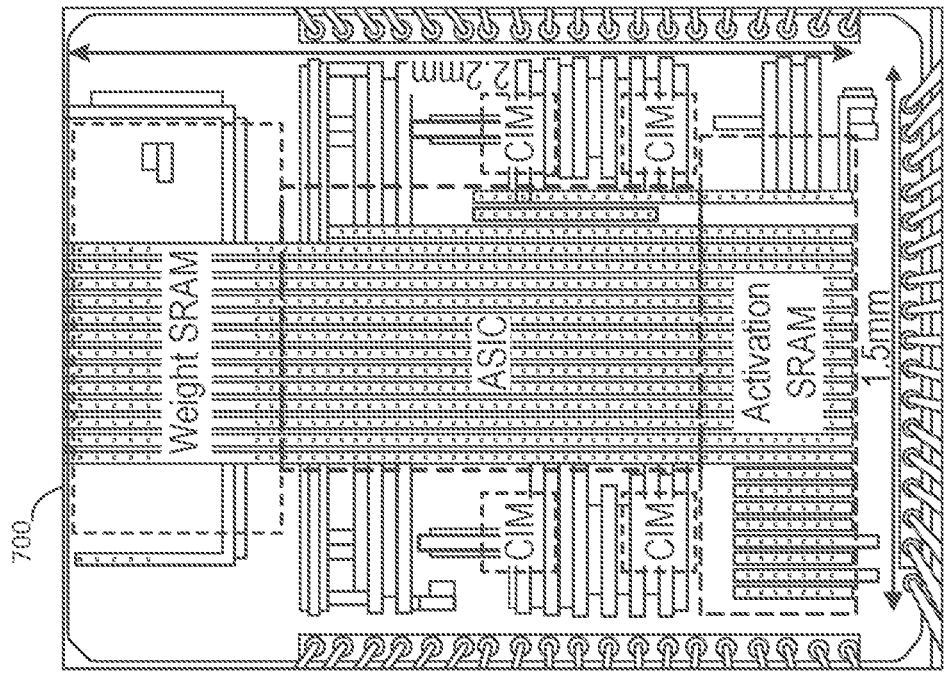

| Technology | 65nm LP |
|---|---|
| Supply Voltage | 0.85V–1.0V |
| Nominal Freq | 105MHz |
| Processor Area | 1.5mm × 2.2mm |
| Single CIM Macro Area | 0.23mm × 0.22mm |
| Single CIM Macro Array Size | 64 × 32 |
| Total Effective CIM Bits | 33kb (=4×64×32×4) |
| Weight Bit Resolution | 4 or 8 bit |
| Activation Bit Resolution | 2 or 4 or 8 Bit |
| Number of Channels | 64 |
| Total Digital SRAM | 172KB |
| Single Macro Power | 4.2mW (Raw); 2.03mW (w/ Sparsity) |
| Total System Power | 52.8mW |
| CIM Macro Energy Efficiency at 1V (TOPS/W) (w/o Sparsity) | Weight=4b, Input=4b: 101.3<br>Weight=8b, Input=4b: 53.2<br>Weight=8b, Input=8b: 26.1 |
| System Energy Efficiency at 1V (TOPS/W) | Weight=4b, Input=4b: 32.6<br>Weight=8b, Input=4b: 16.2<br>Weight=8b, Input=8b: 8.3 |
| Measured Accuracy (CIFAR10) | 90.6% (VGG16, 4b Weight, 4b Input)<br>91.2% (ResNet18, 4b Weight, 4b Input) |

COMPUTING-IN-MEMORY ACCELERATOR DESIGN WITH DYNAMIC ANALOG RAM CELL AND ASSOCIATED LOW POWER TECHNIQUES WITH SPARSITY MANAGEMENT

CROSS-REFERENCE

The present application claims the benefit of priority under 35 U.S.C. § 119 from U.S. Provisional Patent Application Ser. No. 63/137,234 entitled "COMPUTING-IN-MEMORY ACCELERATOR DESIGN WITH DYNAMIC ANALOG RAM CELL AND ASSOCIATED LOW TECHNIQUES WITH SPARSITY MANAGEMENT," filed on Jan. 14, 2021, the disclosure of which is hereby incorporated by reference in its entirety.

STATEMENT OF FEDERALLY FUNDED RESEARCH OR SPONSORSHIP

This invention was made with government support under grant number CCF-1846424 awarded by the National Science Foundation. The government has certain rights in the invention.

TECHNICAL FIELD

The present disclosure generally relates to computing-in-memory (CIM), and more specifically relates to computing-in-memory accelerator design.

BACKGROUND

The computations of a convolutional neural network (CNN) have become a key task for modern machine learning (ML) and artificial intelligence (AI). To accelerate CNN operations in hardware, computing-in-memory (CIM) techniques where memory cells are used to directly perform matrix operations are being developed. However, all existing CIM memory cells are built based on conventional 6-transistor or 8-transistor digital SRAM cells.

SUMMARY

To facilitate understanding of the disclosure, certain description of the drawings may be out-of-sequence or referenced to multiple drawings to describe similar embodiments and their variations.

Systems may be formed by a multi-bit three-transistor (3T) memory cell (i.e., dynamic-analog RAM). In an example, the 3T memory cell may include: a read-access transistor M1 in electrical communication with a read bitline; a switch transistor M2 in electrical communication with the read-access transistor M1; a write-access transistor M3 in electrical communication with the read-access transistor M1 and a write bitline; and a memory node MEM in electrical communication between the read-access transistor M1 and the write-access transistor M3, wherein the memory node MEM is configured to store a 4-bit weight WE.

In another example, an array of the 3T memory cells (i.e., dynamic-analog RAMs) may form a computing-in-memory (CIM) macro, and further form a convolutional neural network (CNN) accelerator by communicating with an application-specific integrated circuit (ASIC) which communicates with a global weight static random access memory and an activation static random access memory.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

FIG. 2A illustrates an example schematic of 3T DARAM.

FIG. 2B illustrates a structural depiction of a 3D metal capacitor C1.

FIG. 2BB depicts an equivalent electrical circuit model of the 3D metal capacitor C1 as illustrated in FIG. 2B.

FIG. 5 is a comparison table with prior works.

FIG. 6A is an example die micrograph according to certain aspects of the disclosure.

FIG. 6B is a table illustrating details of the example die micrograph of FIG. 6A.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Figure 1A:
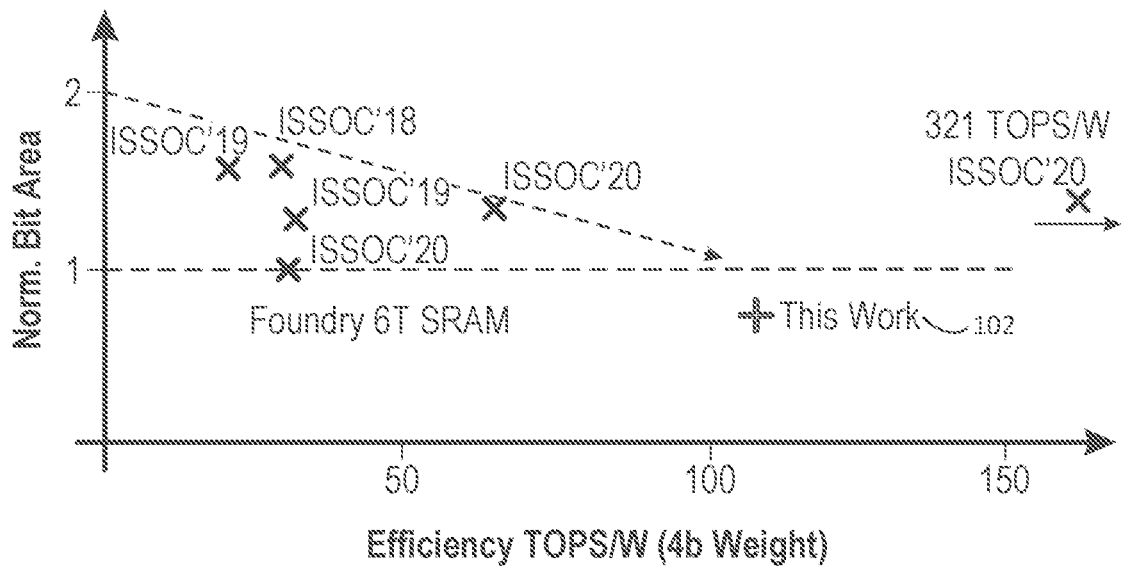
FIGS. 1A and 1B illustrate area limit of CIM SRAM cells.
Figure 1B:
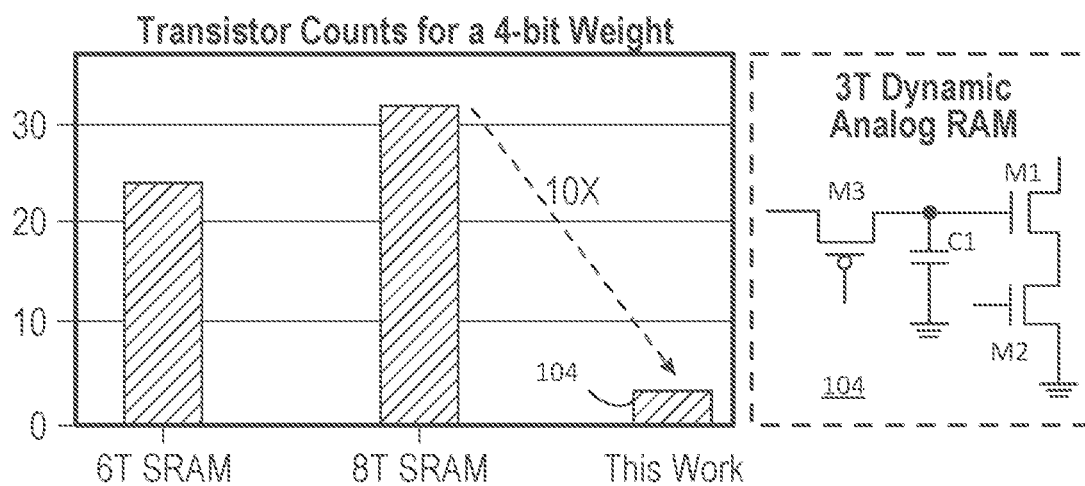
Figure 1C:
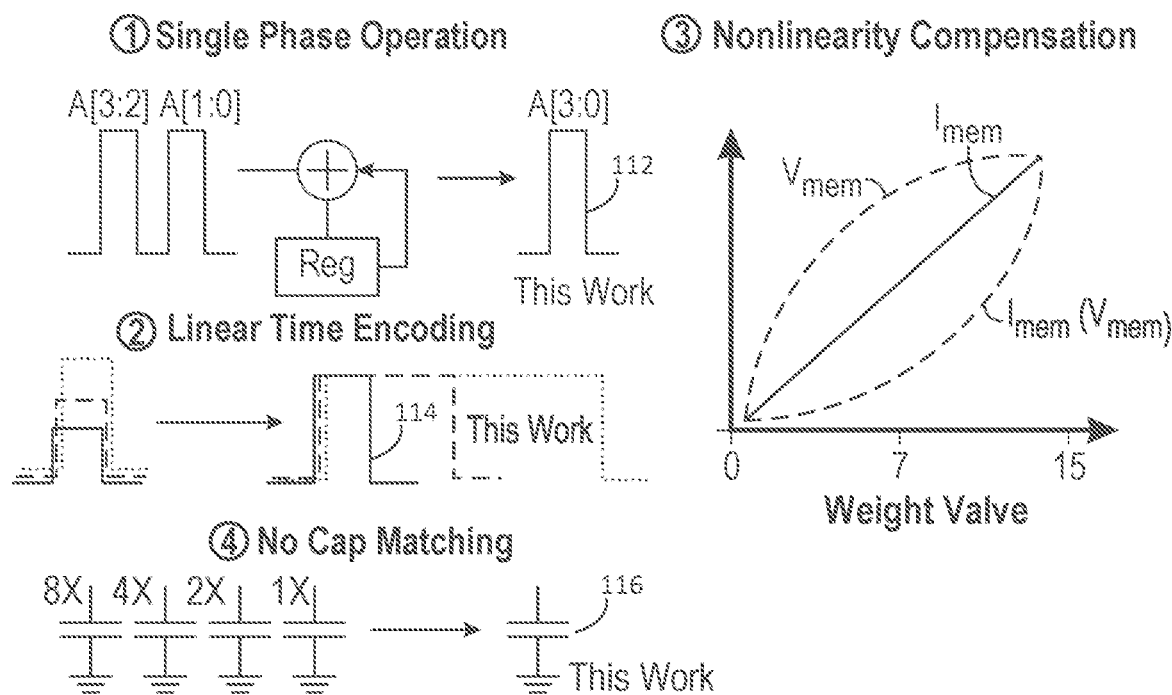
FIG. 1C illustrates linearity and energy enhancement according to certain aspects of the disclosure.
Figure 1D:
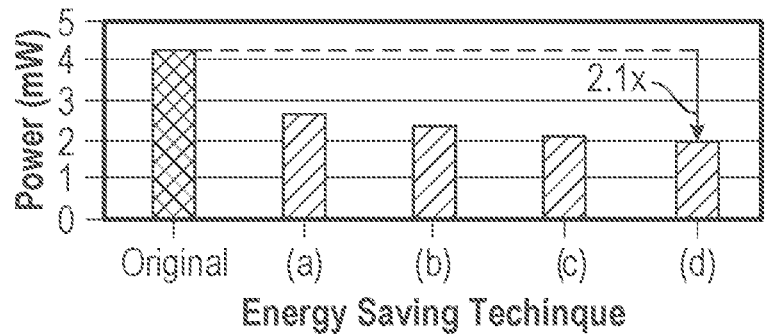
FIG. 1D illustrates macro power reduction according to certain aspects of the disclosure.
Figure 1E:
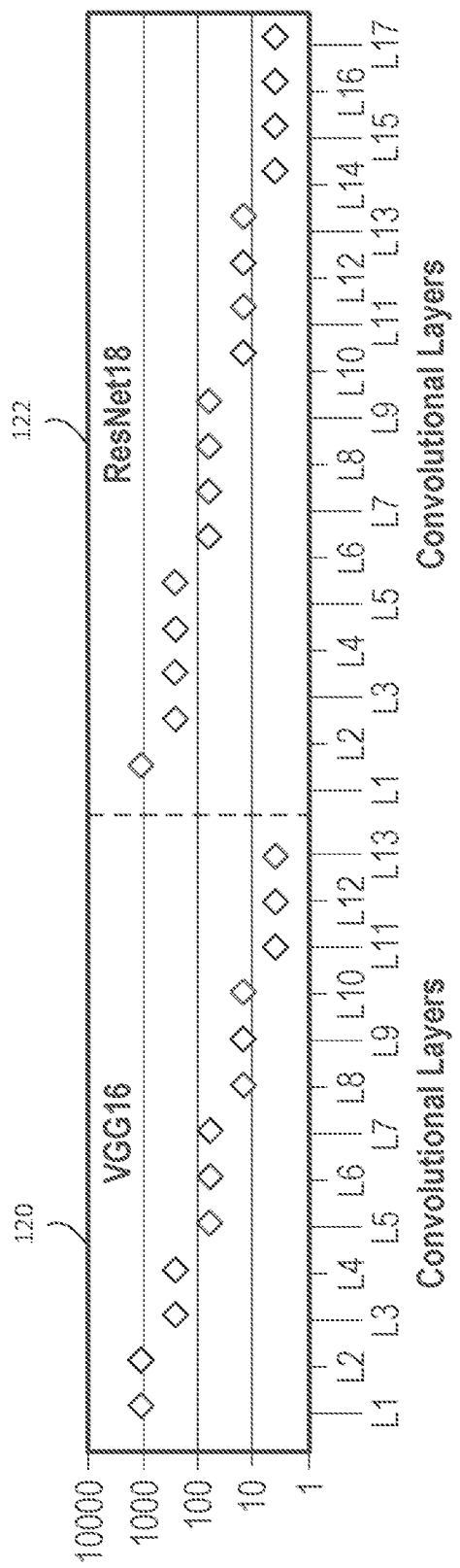
FIG. 1E illustrates stationary cycles of weights in CNN models with batch size equal to 1 according to certain aspects of the disclosure.

The disclosed technology provides a 3-transistor (3T) dynamic-analog RAM cell (see FIG. 2A) and associated computing-in-memory (CIM) accelerator architecture (see FIG. 3A), which dramatically reduces transistor count and operation complexity compared to conventional techniques (e.g., see FIGS. 1A, 1B). In certain aspects, the disclosed technology also provides low power techniques for the CIM based accelerator such as, but not limited to, a rectified linear unit (ReLU) based early termination technique, an analog weight shifting technique, a memory capacitance enhancement technique, a leakage reduction technique, and a memory current nonlinearity compensation technique. Such techniques achieve state of the art efficiency and area efficiency as will be explained in more detail below.

CIM techniques, which incorporate analog computing inside memory macros, have shown significant advantages in computing efficiency for deep learning applications. While earlier CIM macros were limited by lower bit precision, e.g. binary weight, recent works have shown 4 to 8-bit precision for the weights/inputs and up to 20-bit for the output values. Sparsity and application features have also been exploited at the system level to further improve the computation efficiency. To enable higher precision, bit-wise operations may be utilized. However, there are limitations in existing solutions using the bit-wise operations with SRAM cells. FIGS. 1A-1D show a summary of challenges and solutions compared to this work 102, 104. First, all existing traditional solutions utilize 6T/8T/10T SRAM as a CIM cell which fundamentally limits the size of the CIM array (see FIGS. 1A, 1B). In this disclosure (see FIG. 1B, 104), instead of the commonly used SRAM cell, a 3-transistor (3T) analog memory cell 104 is disclosed, referred as dynamic-analog-RAM (DARAM) which represents a 4-bit weight value as an analog voltage. FIG. 1B leads to ~10× reduction of transistor counts and achieves an effective CIM single-bit area smaller than the foundry-supplied 6T SRAM cell for the first time. Secondly, as no bit-wise calculation is needed in this work, only single-phase multiply-accumulate (MAC) operations are performed, removing the throughput degradation associated with previous multi-phase approaches and digital accumulation. Furthermore, analog linearity issues are mitigated by highly linear time-based activation, removal of matching requirements for critical multi-bit caps, and a special read current compensation technique. This disclosure demonstrates the proposed techniques using a 65 nm CIM-based CNN accelerator showing state-of-art energy efficiency.

FIGS. 2A-2F show the 3T dynamic-analog-RAM (DARAM). Similar to a conventional CIM bit cell, the charge drawn to read bitline BL_R is proportional to the multiplication of read current $I_{mem}$ from the read-access transistor $M_1$ and the time-pulse duration of node RE through switch transistor $M_2$. A 4-bit weight may be stored as an analog voltage on the internal "MEM" node generating a read current $I_{mem}$ proportional to the weight value.

Due to the 4-bit lumped analog weight, a 4-bit multiply-accumulate (MAC) operation is realized by a single read of the DARAM, which is considerably simpler than traditional bit-wise operation approaches. Designed with regular logic transistors, the critical read-access transistor $M_1$ may be sized with larger W (width) and L (length) to reduce device variation. The DARAM cell may have an area of 1.9× larger than a traditional 8T CIM cell and 3× larger than a foundry 6T SRAM cell leading to an effective bit area of 47% of the 8T CIM cell and 75% of the foundry 6T SRAM cell. During write phase, controlled by node WE, the write-access transistor $M_3$ is used to write the analog voltage from write bitline BL_W to the "MEM" node from a column-wise DAC 310a-310n (see FIG. 3B) with an adjustable voltage range from 0.45V to 1V. Each write can be finished within one clock cycle with a total of 64 clock cycles to write an entire CIM macro (64 rows array). Subthreshold and gate leakage are minimized to maintain a constant analog voltage during the life cycle of stationary weights for the CNN operation.

With reference to FIGS. 1A-1D, the weight stationary cycles of CNN models (e.g. VGG16 or ResNet18) vary from a few tens of cycles to thousands of cycles for a single image and increase proportionally with a batch size, driving a retention requirements for the analog voltage.

Figure 2C:
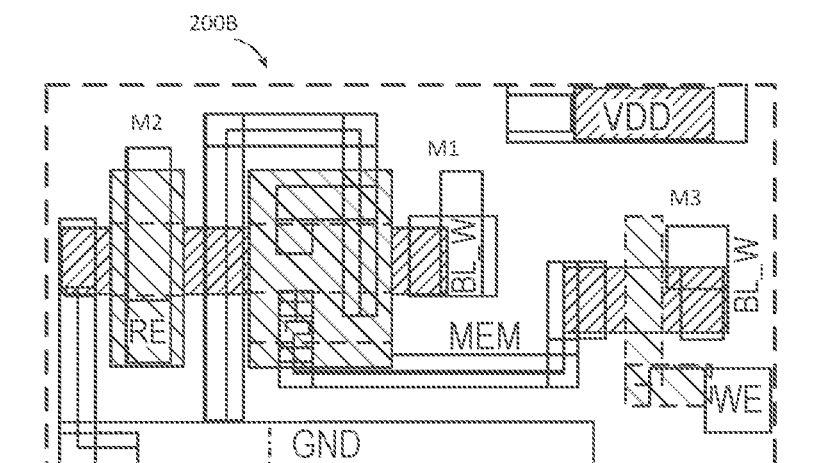
FIG. 2C illustrates an example layout of 3T DARAM.
Figure 2D:
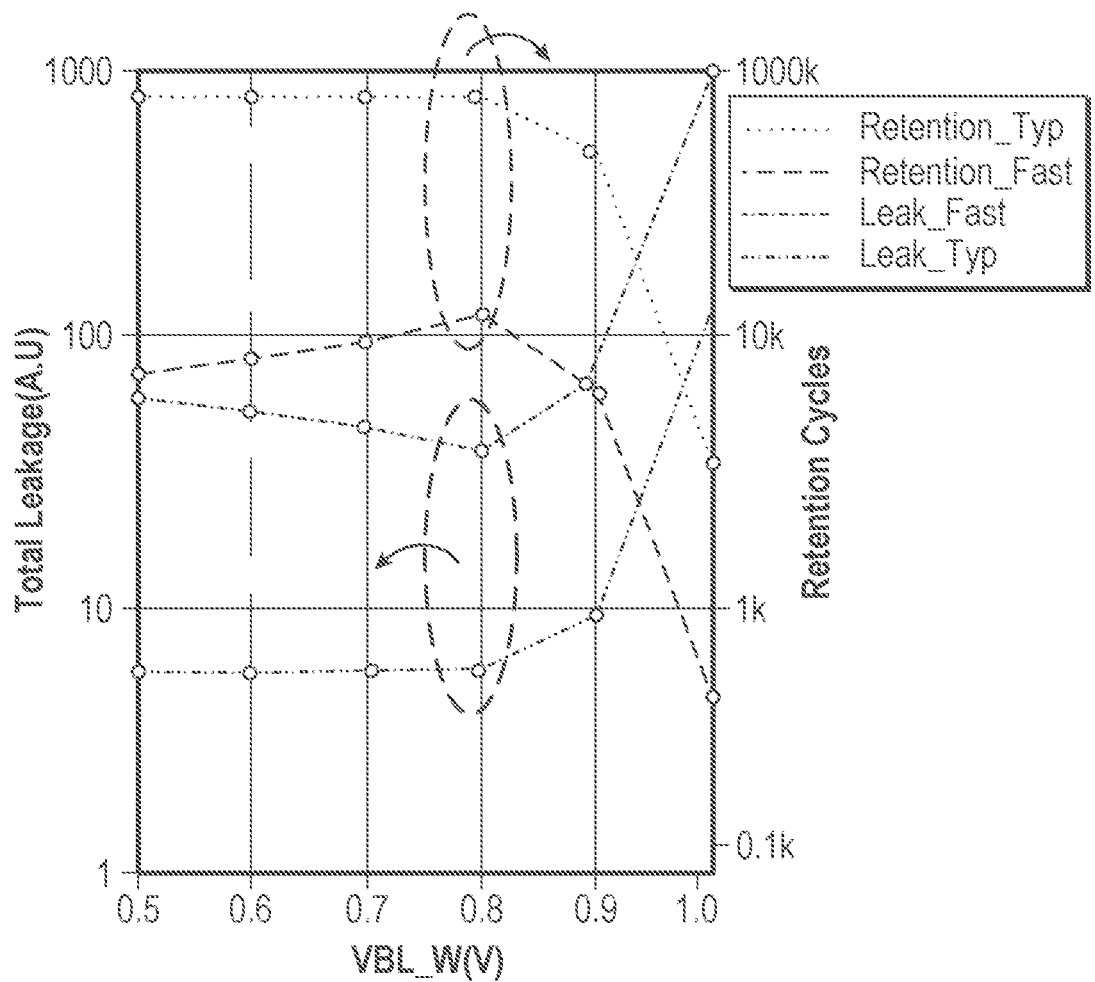
FIG. 2D illustrates leakage of DARAM.
Figure 2E:
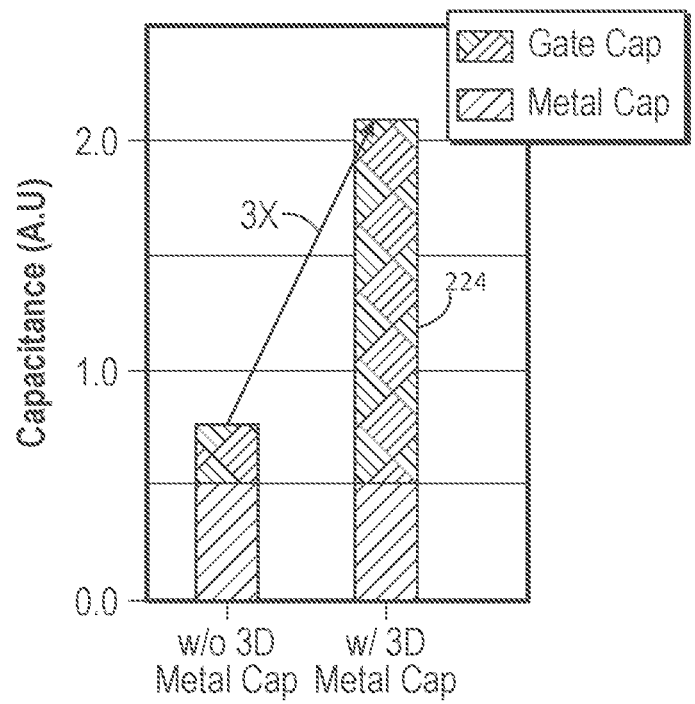
FIG. 2E illustrates metal cap improvement.
Figure 2F:
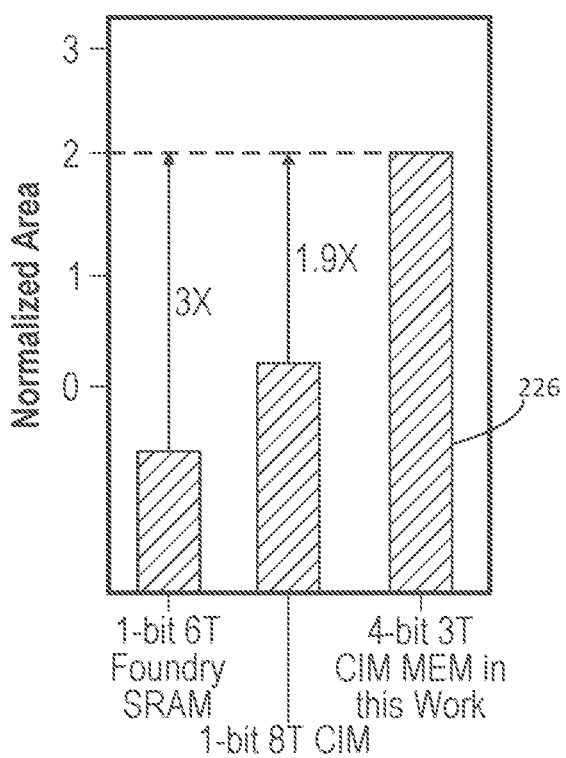
FIG. 2F illustrates memory cell area comparison.

FIG. 2B discloses a special 3D inter-layer/inter-digit metal capacitor 202a using vertically stacked M1 to M5 interleaving MEM and GND nodes vertically and horizontally is added inside each DARAM cell to enhance the storage capacitance by 3×. With reference to FIGS. 2A-2F, during CNN inference, separate biasing of BL_W at 0.8V leads to about a 20× reduction in subthreshold leakage current. This allows a retention time of ~41 k cycles (for a voltage drift less than half of a single bit) at typical corner and more than 5 k cycles at a fast corner. As a result, a batch size of 5 to 40 images can be processed without a rewrite (refresh) operation with negligible accuracy loss. For a larger batch size, a 64-cycle DARAM refresh operation is needed at every 5.5 k to 41 k cycles, leading to a throughput overhead of less than 1.2% or a CIM macro energy overhead of less than 0.4%. Note for a smaller batch size or CNN layers with less stationary weights, refresh may not be needed.

FIGS. 3A-3F depict an architecture of the CNN accelerator 300 with 4 CIM macros 302a-302d. Each CIM macro (e.g., 302a) contains a 64×32 DARAM array. A row-wise digital-time-converter (DTC) 314a is used to convert a 4-bit activation into a time pulse with 50 ps resolution. A 5-bit successive approximation registers (SAR) analog to digital converter (ADC) 316a-316n and a 4-bit current digital to analog converter (DAC) 310a-310n are implemented at each respective columns 1-32 to provide respective MAC readout and analog write-in.

The 3T DARAM memory cell 330a design natively may support a 4-bit input/weight operation and may also support a 8-bit/8-bit by combining two 3T DARAM cells (330a, 331a) and operating in successive two cycles.

Similar to prior schemes, global static random access memories (SRAMs)304 are used to store weight and input/output activation data before being fetched into the CIM macros 302a-302d. An ASIC core 308 may be used to manage data sequencing and pre/post-processing including (a) offsetting of data values due to the non-2's complementary format of weights in comparison with the support of both non-2's and 2's complement formats in prior works. An offset calculation 321 may have negligible overhead as it is commonly shared by all the columns 1-32; (b) 4-bit-to-8-bit conversion if needed; (c) accumulation at inter-macro loop.

An additional three features may be introduced in this work. One feature, (1) an input-stationary operation mode, may be supported, which is more efficient for later layers in VGG/Resnet. A second feature, (2) a special analog weight shifting technique, may be introduced where the weights may be shifted down whenever a weight range in a column (e.g., column 1) may not be fully utilized, thereby reducing multiply-accumulate (MAC) energy consumption which favors lower weight values. The shifted weights may be pre-determined off-chip according to the weights being used and the associated multiply-accumulate (MAC) offsets 321 may be added back in the ASIC 308 to restore the values.

Referring to FIGS. 3A-3F, an average of 3-bit weight shifting (see FIG. 3F) may be achieved, providing a 1.3× energy reduction for MAC operations. A third feature of (3) input sparsity may also be leveraged by detecting zero inputs 323 from the ASIC 308 and disabling the row-wise DTC 314a and the associated MAC operations in the CIM macro 302a (see FIG. 3D).

FIGS. 6A-6B discloses a 65 nm CMOS test chip was fabricated to demonstrate the DARAM in a CNN accelerator 700 running at 105 MHz at 1V. Calibration was performed to remove some variation impacts, e.g. ADC, DAC offset, etc. by adding small offsets in the ASIC. As shown in the measurement results in FIGS. 4A-4F, a retention time of up to 0.36 ms (38 k cycles) without refresh was observed with negligible accuracy degradation supporting a batch size of 37 images in VGG16. With larger batch size, the refresh operations incurred up to 0.17% throughput overhead.

A comparison with prior work is shown in FIG. 5. Compared with the closest system implementation, a 4-bit weight/in-put operation, an 8× system energy efficiency improvement at 44.7TOPS/W is achieved along with 3× area reduction in macro size. Overall, this disclosure achieves a macro efficiency of 217TOPs/W at 4b, which is 3× higher than those reported in closer technologies and is only 32% lower than that reported in a recent 7 nm technology. In addition, the effective bit cell area is smaller than the foundry-supplied 6T SRAM. FIGS. 6A and 6B show a die photo and additional information.

In implementation, FIG. 2A discloses a three-transistors (3T) memory cell 200A, which includes: a read-access transistor $M_1$ in electrical communication with a read bitline BL_R; a switch transistor $M_2$ in electrical communication with the read-access transistor $M_1$; a write-access transistor $M_3$ in electrical communication with the read-access transistor $M_1$ and a write bitline BL_W; and a memory node MEM in electrical communication between the read-access transistor $M_1$ and the write-access transistor M3, wherein the memory node MEM is configured to store a 4-bit weight WE.

In an example, the switch transistor $M_2$ may include an input node RE for receiving 4-bit time pulsed input, wherein the 4-bit weight WE stored at the memory node MEM generates a read current $I_{MEM}$ proportional to a weight value that is configurable up to the 4-bit weight, thus forming a dynamic-analog-random access memory (DARAM) with a configurable bit weight. The write-access transistor $M_3$, during a write phase, may be configured to write an analog voltage V_MAC from the write bitline BL_W to the memory node MEM.

In an example, the read-access transistor $M_1$ and the switch transistor $M_2$ may be in series connection, and the read-access transistor $M_1$ and the write-access transistor $M_3$ may be in cascode connection. In an example, the switch transistor $M_2$ and the read-access transistor $M_1$ may be both N-channel MOSFETs and the write-access transistor $M_3$ may be a P-channel MOSFET.

FIG. 2B illustrates a structural depiction of a 3D metal capacitor C1. In an example, the memory node MEM that stores the 4-bit weight may be a three-dimensional (3D) interlayer/interdigit metal capacitor C1, wherein the 3D interlayer/interdigit metal capacitor C1 may include a plurality of vertically stacked metal layers M1 to M5 that form vertically and horizontally interleaving memory nodes MEM and ground nodes GND to enhance storage capacitance.

FIG. 2BB depicts an equivalent electrical circuit model of the 3D metal capacitor C1 as illustrated in FIG. 2B. The equivalent electrical circuit model 302B of the 3D metal capacitor C1 formed by the vertically interleaving memory nodes MEM and ground nodes GND may be modeled as vertically stacked series capacitors 204-212, wherein each of the series capacitors 204-212 in the vertical stack corresponds to a capacitance value with respect to a corresponding pair of MEM and GND nodes. In addition, a horizontal interdigitated structure having formed on each metal layer in the vertical stack may corresponds to respective horizontal capacitors 203-211.

Figure 3A:
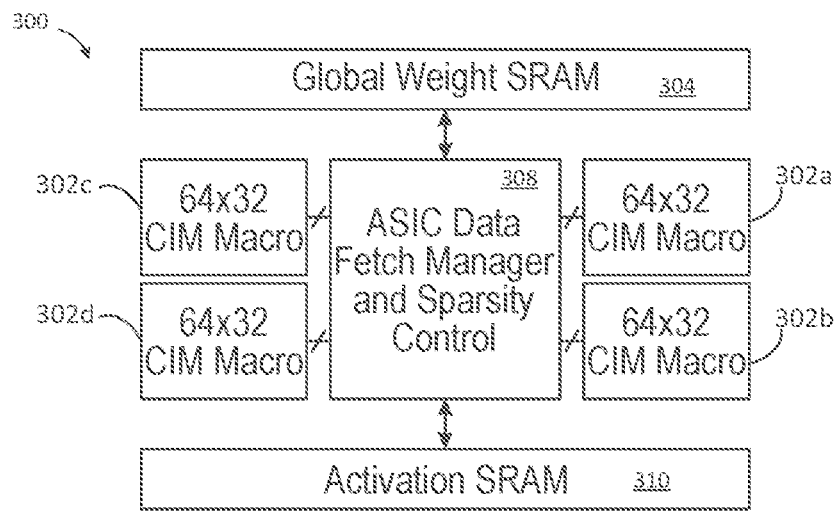
FIG. 3A illustrates an example CNN accelerator architecture according to certain aspects of the disclosure.
Figure 3B:
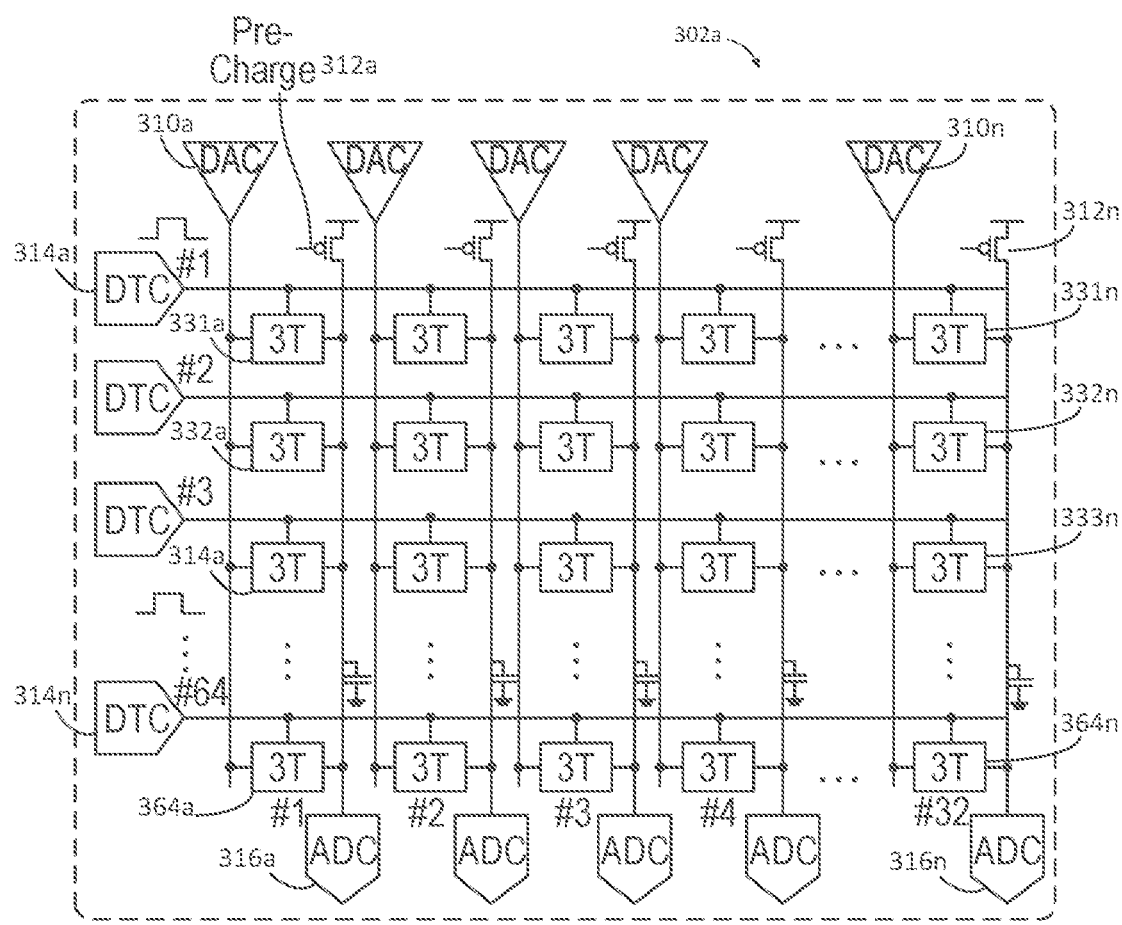
FIG. 3B illustrates an example CIM macro of FIG. 3A.
Figure 3C:
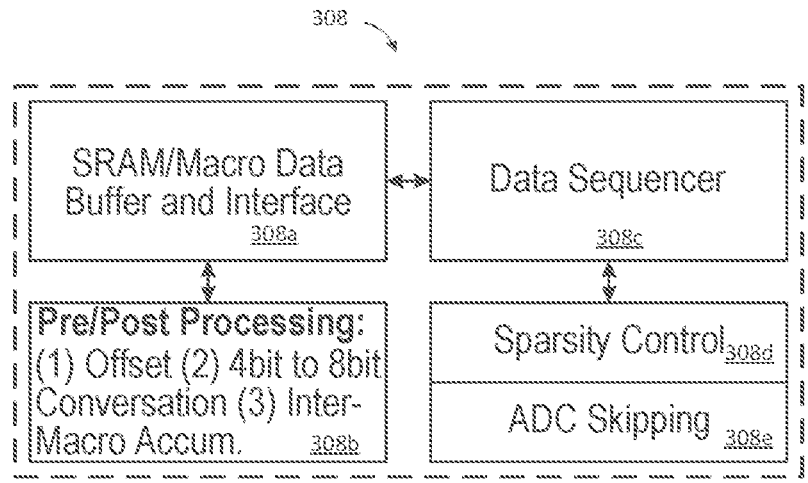
FIG. 3C illustrates an example ASIC data fetch manager with sparsity control of FIG. 3A.
Figure 3D:
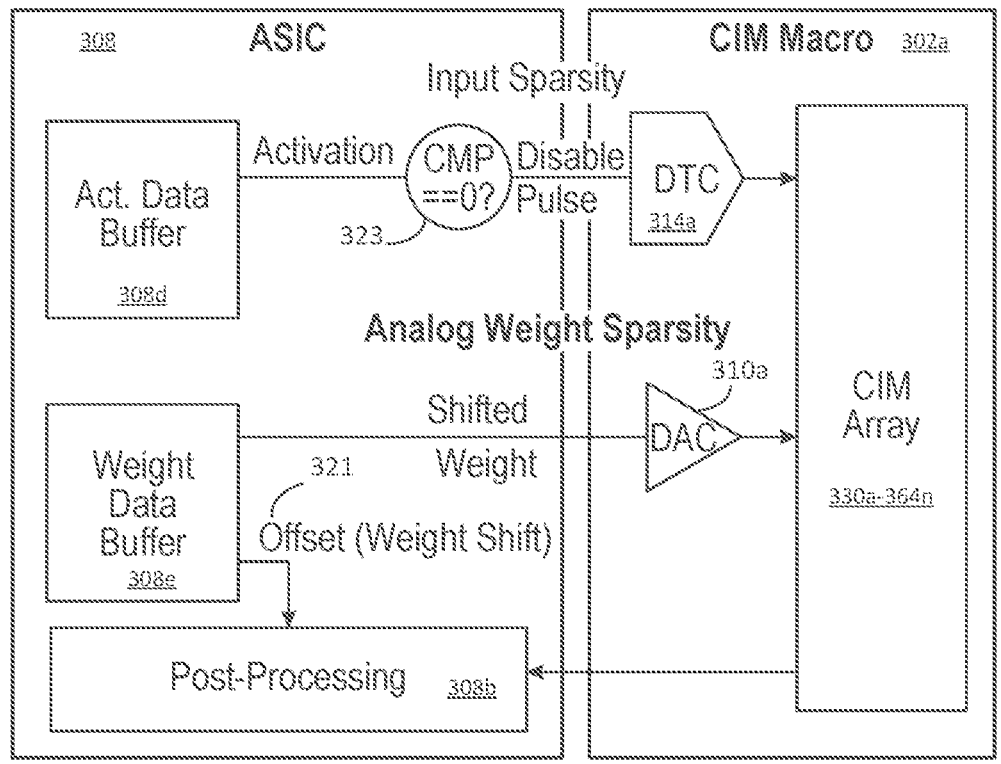
FIG. 3D illustrates an example sparsity control of FIG. 3A.
Figure 3E:
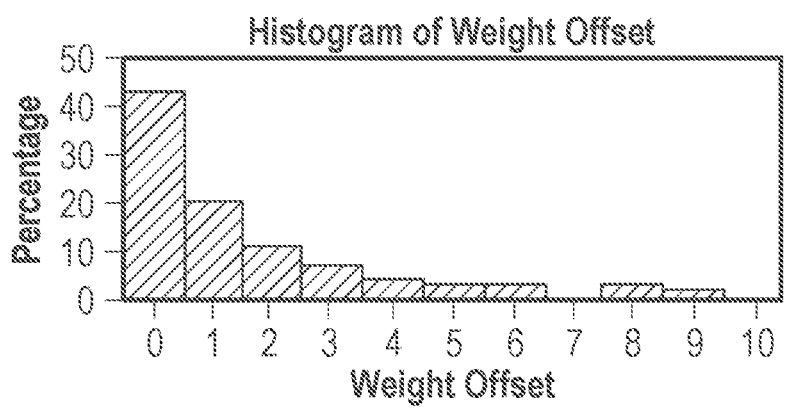
FIGS. 3E and 3F illustrate weight offset.
Figure 3F:
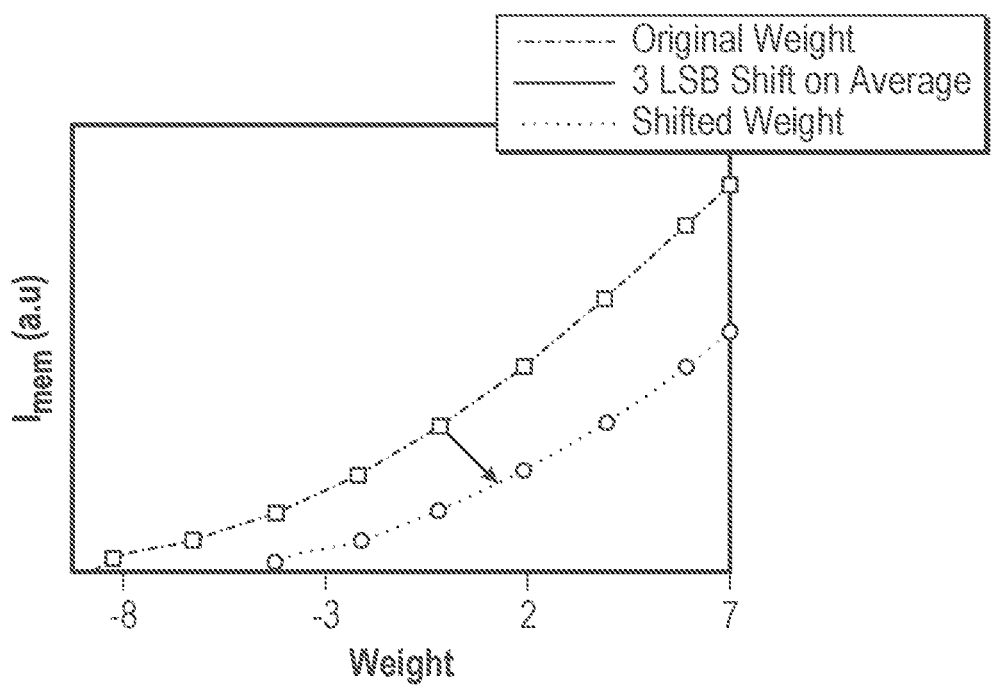

In another example, the 3T memory cell may be configured to form a computing-in-memory macro 300, when a plurality of the 3T memory cells 302a-302d with configurable bit weights may be arranged with defined rows and columns to form a dynamic-analog-RAM array (DARAM), such as a 64×32 array as shown in FIG. 3B.

Figure 4A:
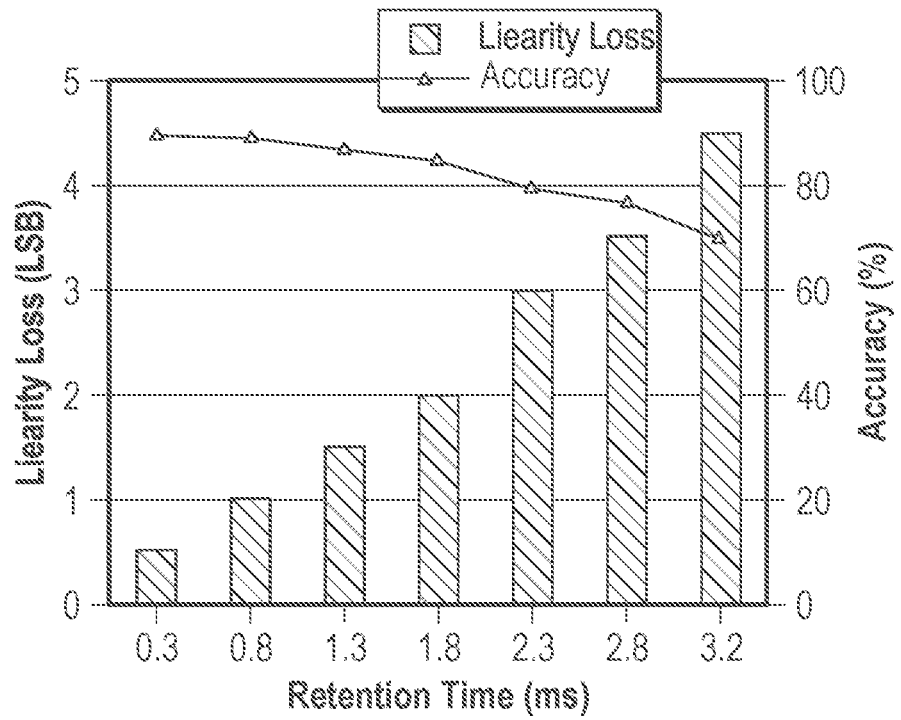
FIG. 4A is a chart illustrating memory cell retention time (VGG16 on Cifar10) according to certain aspects of the disclosure.
Figure 4B:
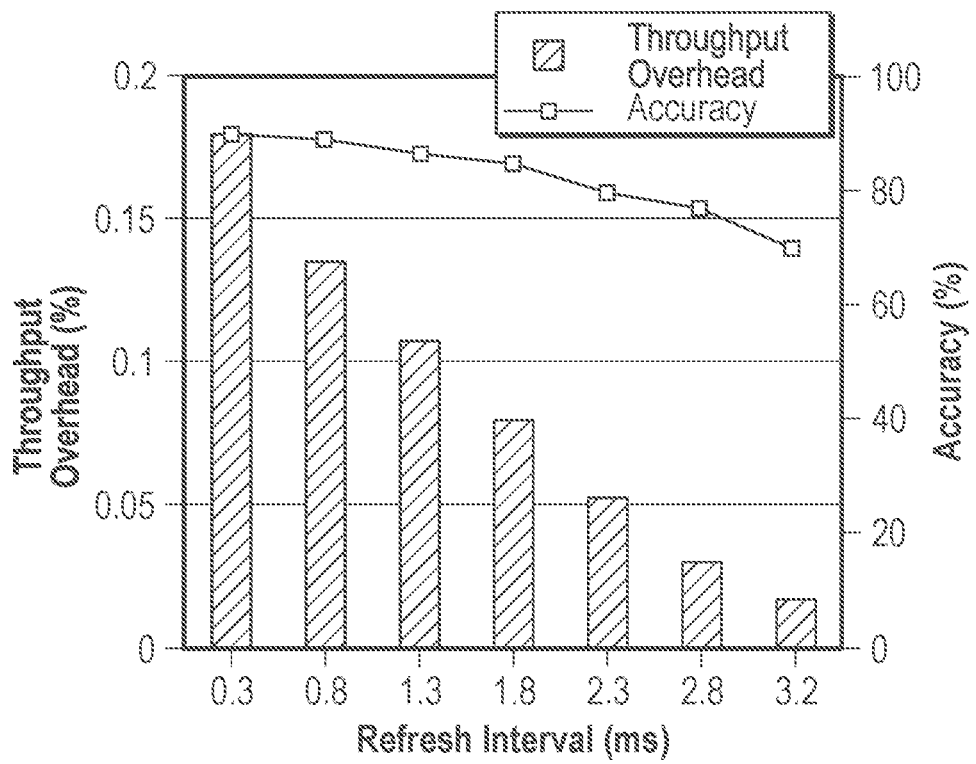
FIG. 4B is a chart illustrating weight refresh (VGG16 on Cifar10) according to certain aspects of the disclosure.
Figure 4C:
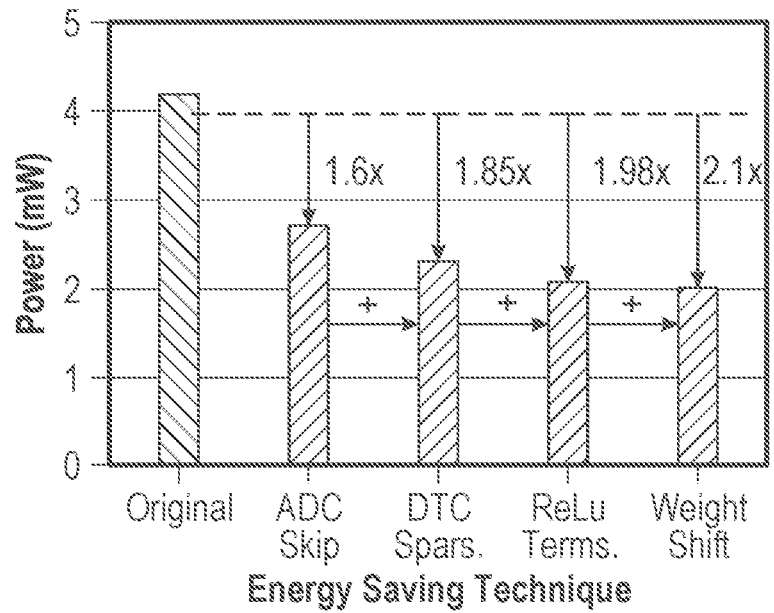
FIG. 4C is a chart illustrating energy improvement (VGG16 on Cifar10) according to certain aspects of the disclosure.
Figure 4D:
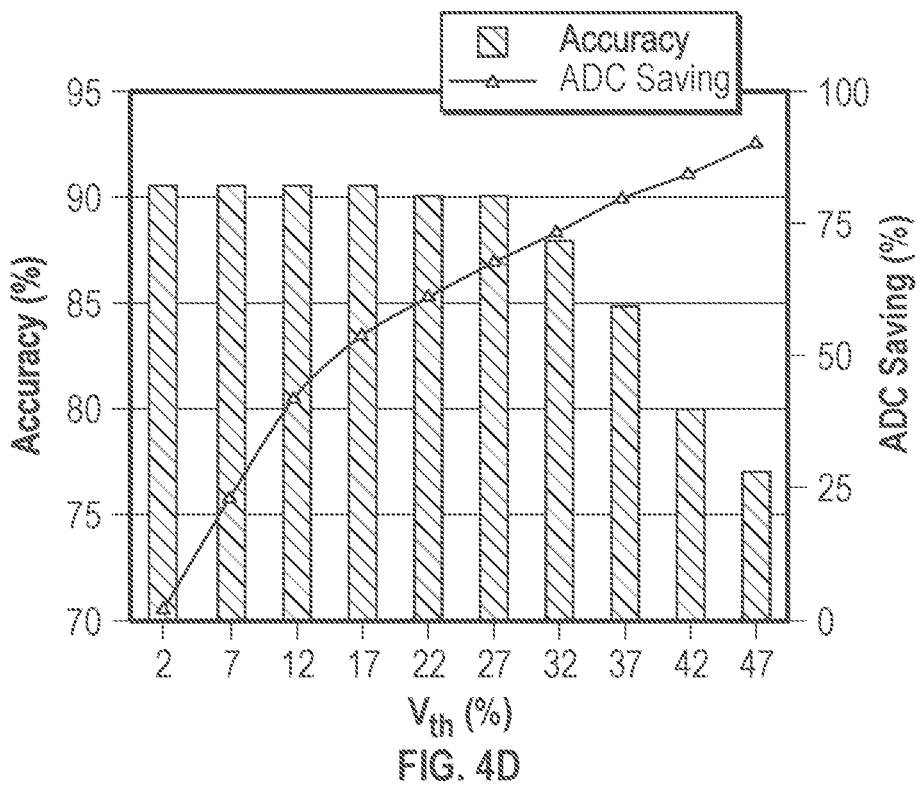
FIG. 4D is a chart illustrating ADC Vth performance (VGG16 on Cifar10) according to certain aspects of the disclosure.
Figure 4E:
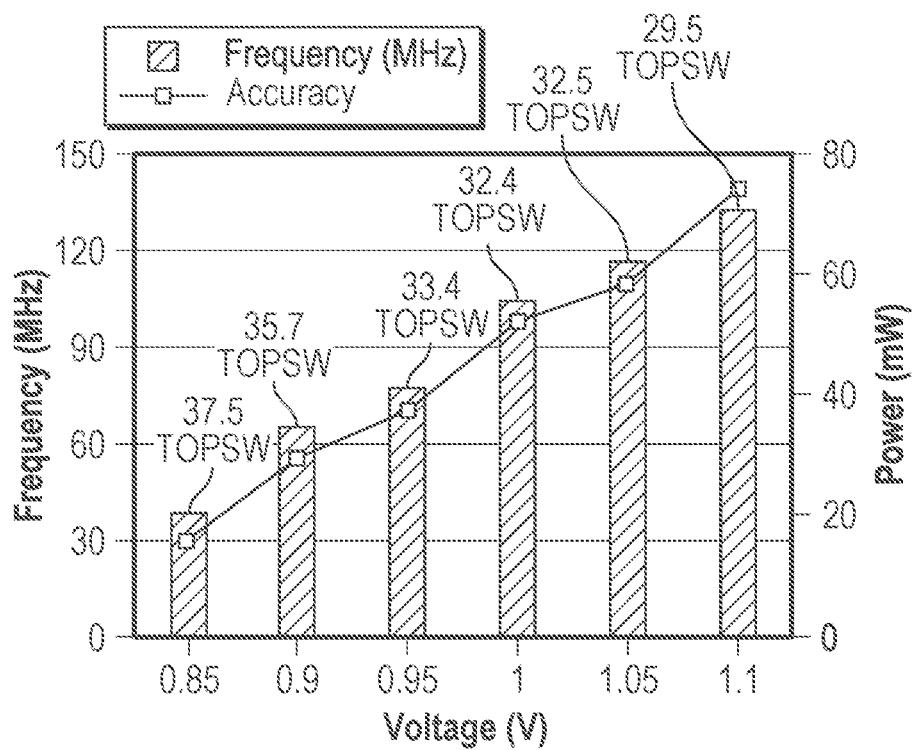
FIG. 4E is a chart illustrating Voltage-frequency scaling (VGG16 on Cifar10) according to certain aspects of the disclosure.
Figure 4F:
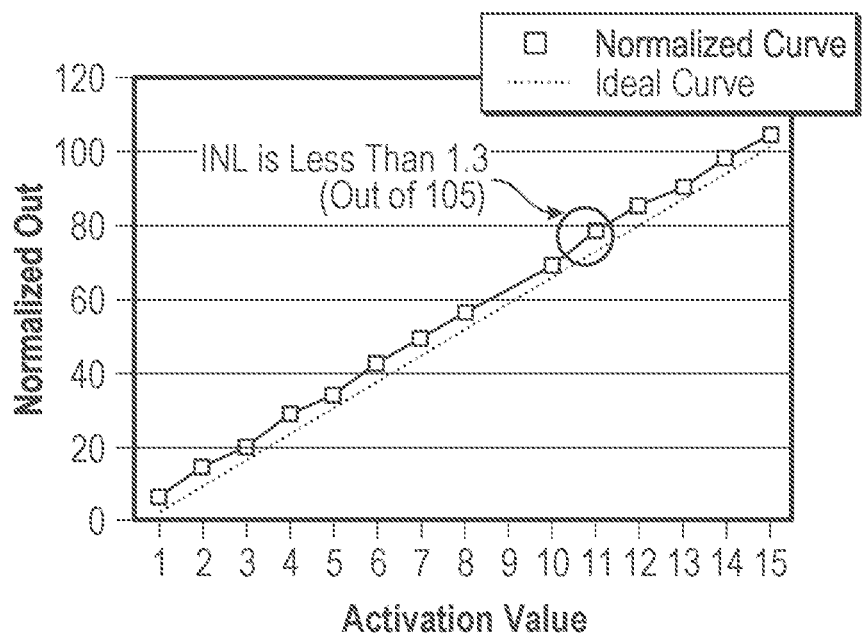
FIG. 4F is chart illustrating MAC linearity (weight=7) according to certain aspects of the disclosure.

FIGS. 3A 4B disclose a convolutional neural network (CNN) accelerator 300a, includes: an application-specific integrated circuit (ASIC) 308; a global weight static random access memory 304 in communication with the application-specific integrated circuit 308; an activation static random access memory 310 in communication with the ASIC 308; and at least one computing-in-memory (CIM) macro 302a-302d in communication with the ASIC 308. For example, the at least one computing-in-memory macro 302a may include a dynamic-analog-RAM array includes at least one three-transistors (3T) memory cell 330a. The three-transistors (3T) memory cell 330a includes a read-access transistor $M_1$ in electrical communication with a read bitline BL_R, a switch transistor $M_2$ in electrical communication with the read-access transistor $M_1$, a write-access transistor $M_3$ in electrical communication with the read-access transistor $M_1$ and a write bitline BL_W, and a memory node MEM in electrical communication between the read-access transistor $M_1$ and the write-access transistor $M_3$, wherein the memory node MEM is configured to store a 4-bit weight.

In an example, the dynamic-analog-RAM array may be a 64 by 32 array (see FIG. 3B). The at least one computing-in-memory macro 302a may include first through fourth computing-in-memory macros 302a-302d. The ASIC 308 may be configured to manage data sequencing, pre-processing, and post-processing. The ASIC 308 may include an input-stationary operation mode, and the ASIC 308 may include an analog weight shifting mode wherein the weights are shifted down whenever a weight range in a column of the dynamic-analog-RAM (DARAM) array is not utilized.

In an example, the ASIC 308 in the convolutional neural network accelerator 300 may include an input sparsity mode for detecting zero inputs from the application-specific integrated circuit and disabling a row-wise digital-time-converter (DTC) 314a-364n of the dynamic-analog-RAM array and associated multiply-accumulate (MAC) operations of the at least one CIM macro 302a-302d.

It should be understood from the above that the disclosed technology provides improvements including, but not limited to, a smaller memory cell size using 10× less number of transistors for each memory bit, simpler operations leading to lower power for the same computing tasks, and lower power or higher energy efficiency through a set of low power techniques.

We claim:

1. A three-transistors (3T) memory cell, comprising:
a read-access transistor $M_1$ in electrical communication with a read bitline;
a switch transistor $M_2$ in electrical communication with the read-access transistor $M_1$;
a write-access transistor $M_3$ in electrical communication with the read-access transistor $M_1$ and a write bitline; and
a memory node MEM in electrical communication between the read-access transistor $M_1$ and the write-access transistor $M_3$, wherein the memory node MEM is configured to store a 4-bit weight WE,
wherein the 4-bit weight WE stored at the memory node MEM generates a read current $I_{MEM}$ proportional to a weight value that is configurable up to the 4-bit weight forming a dynamic-analog-random access memory (DARAM) with a configurable bit weight,
wherein the memory node MEM that stores the 4-bit weight comprises a three-dimensional (3D) interlayer/interdigit metal capacitor,
wherein the 3D interlayer/interdigit metal capacitor comprises a plurality of vertically stacked metal layers that form vertically and horizontally interleaving memory nodes MEM and ground nodes GND to enhance storage capacitance,
wherein the vertically interleaving memory nodes MEM and ground nodes GND form vertically stacked series capacitors, wherein each of the series capacitors in the vertical stack corresponds to a capacitance value with respect to a corresponding pair of MEM and GND nodes, and a horizontal interdigitated structure having formed on each metal layer each metal layer in the vertical stack corresponds to respective horizontal capacitors.

2. The 3T memory cell of claim 1, wherein the switch transistor $M_2$ comprises an input node RE for receiving 4-bit time pulsed input.

3. The 3T memory cell of claim 1, wherein the write-access transistor $M_3$, during a write phase, is configured to write an analog voltage from the write bitline to the memory node MEM.

4. The 3T memory cell of claim 1, wherein the read-access transistor $M_1$ and the switch transistor $M_2$ are in series connection, and the read-access transistor $M_1$ and the write-access transistor $M_3$ are in a cascode connection.

5. The 3T memory cell of claim 1, wherein the switch transistor $M_2$ and the read-access transistor $M_1$ are both N-channel MOSFETs and the write-access transistor $M_3$ is a P-channel MOSFET.

6. The 3T memory cell of claim 1, is configured to form a computing-in-memory macro, when a plurality of the 3T memory cells with configurable bit weights are being arranged with defined rows and columns to form a dynamic-analog-RAM array (DARAM).

7. A convolutional neural network (CNN) accelerator, comprising:
an application-specific integrated circuit (ASIC);
a global weight static random access memory in communication with the application-specific integrated circuit;
an activation static random access memory in communication with the application-specific integrated circuit; and
at least one computing-in-memory (CIM) macro in communication with the application-specific integrated circuit,
wherein the at least one computing-in-memory macro comprises a dynamic-analog-RAM array comprising at least one three-transistors (3T) memory cell,
wherein the three-transistors (3T) memory cell comprises a read-access transistor $M_1$ in electrical communication with a read bitline, a switch transistor $M_2$ in electrical communication with the read-access transistor $M_1$, a write-access transistor $M_3$ in electrical communication with the read-access transistor $M_1$ and a write bitline, and a memory node in electrical communication between the read-access transistor $M_1$ and the write-access transistor $M_3$, wherein the memory node is configured to store a 4-bit weight,
wherein the application-specific integrated circuit comprises an analog weight shifting mode wherein the weights are shifted down whenever a weight range in a column of the dynamic-analog-RAM (DARAM) array is not utilized.

8. The convolutional neural network accelerator claim 7, wherein the dynamic-analog-RANI array is a 64 by 32 array.

9. The convolutional neural network accelerator of claim 7, wherein the at least one computing-in-memory macro comprises first through fourth computing-in-memory macros.

10. The convolutional neural network accelerator of claim 7, wherein the application-specific integrated circuit is configured to manage data sequencing, pre-processing, and post-processing.

11. The convolutional neural network accelerator of claim 7, wherein the application-specific integrated circuit comprises an input-stationary operation mode.

12. A convolutional neural network (CNN) accelerator, comprising:
an application-specific integrated circuit (ASIC);
a global weight static random access memory in communication with the application-specific integrated circuit;
an activation static random access memory in communication with the application-specific integrated circuit; and
at least one computing-in-memory (CIM) macro in communication with the application-specific integrated circuit,
wherein the at least one computing-in-memory macro comprises a dynamic-analog-RAM array comprising at least one three-transistors (3T) memory cell,
wherein the three-transistors (3T) memory cell comprises a read-access transistor $M_1$ in electrical communication with a read bitline, a switch transistor $M_2$ in electrical communication with the read-access transistor $M_1$, a write-access transistor $M_3$ in electrical communication with the read-access transistor $M_1$ and a write bitline, and a memory node in electrical communication between the read-access transistor $M_1$ and the write-access transistor $M_3$, wherein the memory node is configured to store a 4-bit weight,
wherein the application-specific integrated circuit comprises an input sparsity mode for detecting zero inputs from the application-specific integrated circuit and disabling a row-wise digital-time-converter (DTC) of the dynamic-analog-RAM array and associated multiply-accumulate (MAC) operations of the at least one computing-in-memory macro,
wherein the row-wise digital-time-converter (DTC) implements 5-bit successive approximation registers (SAR) ADC and a 4-bit current DAC to each column to provide column-wise MAC read-out and analog write-in.

13. The convolutional neural network accelerator of claim 12, wherein the 4-bit current DAC to each column is configured to compensate non-linearities in memory voltage and memory current in the three-transistors (3T) memory cells to each respective column.

* * * * *